(12) United States Patent
Pieler et al.

(10) Patent No.: US 10,396,545 B2
(45) Date of Patent: Aug. 27, 2019

(54) INSULATION MONITORING DEVICE HAVING VOLTAGE MONITORING AND UNDERLYING METHOD

(71) Applicant: Bender GmbH & Co. KG, Gruenberg (DE)

(72) Inventors: Dirk Pieler, Gruenberg (DE); Oliver Schaefer, Gruenberg (DE)

(73) Assignee: BENDER GMBH & CO. KG, Gruenberg (DE)

( * ) Notice: Subject to any disclaimer, the term of this patent is extended or adjusted under 35 U.S.C. 154(b) by 558 days.

(21) Appl. No.: 15/135,736

(22) Filed: Apr. 22, 2016

(65) Prior Publication Data

US 2016/0315461 A1 Oct. 27, 2016

(30) Foreign Application Priority Data

Apr. 23, 2015 (DE) .................. 10 2015 207 456

(51) Int. Cl.
*H02H 3/16* (2006.01)
*H02H 3/20* (2006.01)
*G01R 31/02* (2006.01)
*G01R 31/12* (2006.01)

(52) U.S. Cl.
CPC ............... *H02H 3/20* (2013.01); *H02H 3/16* (2013.01); *G01R 31/025* (2013.01); *G01R 31/1272* (2013.01)

(58) Field of Classification Search
CPC .......... H02H 3/16; H02H 3/20; G01R 31/025; G01R 31/1272

USPC .......................................................... 361/86
See application file for complete search history.

(56) References Cited

U.S. PATENT DOCUMENTS

| 5,390,066 A | 2/1995 | Parrier | |
|---|---|---|---|
| 2005/0280422 A1* | 12/2005 | Kishibata | G01R 31/025 324/522 |
| 2008/0084215 A1* | 4/2008 | Itten | G01R 27/18 324/510 |
| 2013/0328571 A1* | 12/2013 | Schepp | G01R 27/16 324/551 |

FOREIGN PATENT DOCUMENTS

| DE | 2325306 A1 | 11/1974 |
|---|---|---|
| DE | 4339241 A1 | 5/1995 |
| DE | 10111816 A1 | 12/2002 |
| JP | 2006025529 A | 1/2006 |

* cited by examiner

*Primary Examiner* — Kevin J Comber
(74) *Attorney, Agent, or Firm* — King & Schickli, PLLC

(57) ABSTRACT

The invention relates to an insulation monitoring device and to a method for conforming-to-standards monitoring of an insulation resistance of an ungrounded single-phase or multi-phase power supply system having at least two active conductors. According to the invention, the insulation monitoring device comprises a voltage monitoring circuit for permanently registering the conductor voltage to ground potential for at least one active conductor. If an excess voltage is detected on an active conductor, the voltage monitoring circuit generates a shut-down signal so as to shut down the power supply system.

12 Claims, 5 Drawing Sheets

INSULATION MONITORING DEVICE HAVING VOLTAGE MONITORING AND UNDERLYING METHOD

Figure 1:
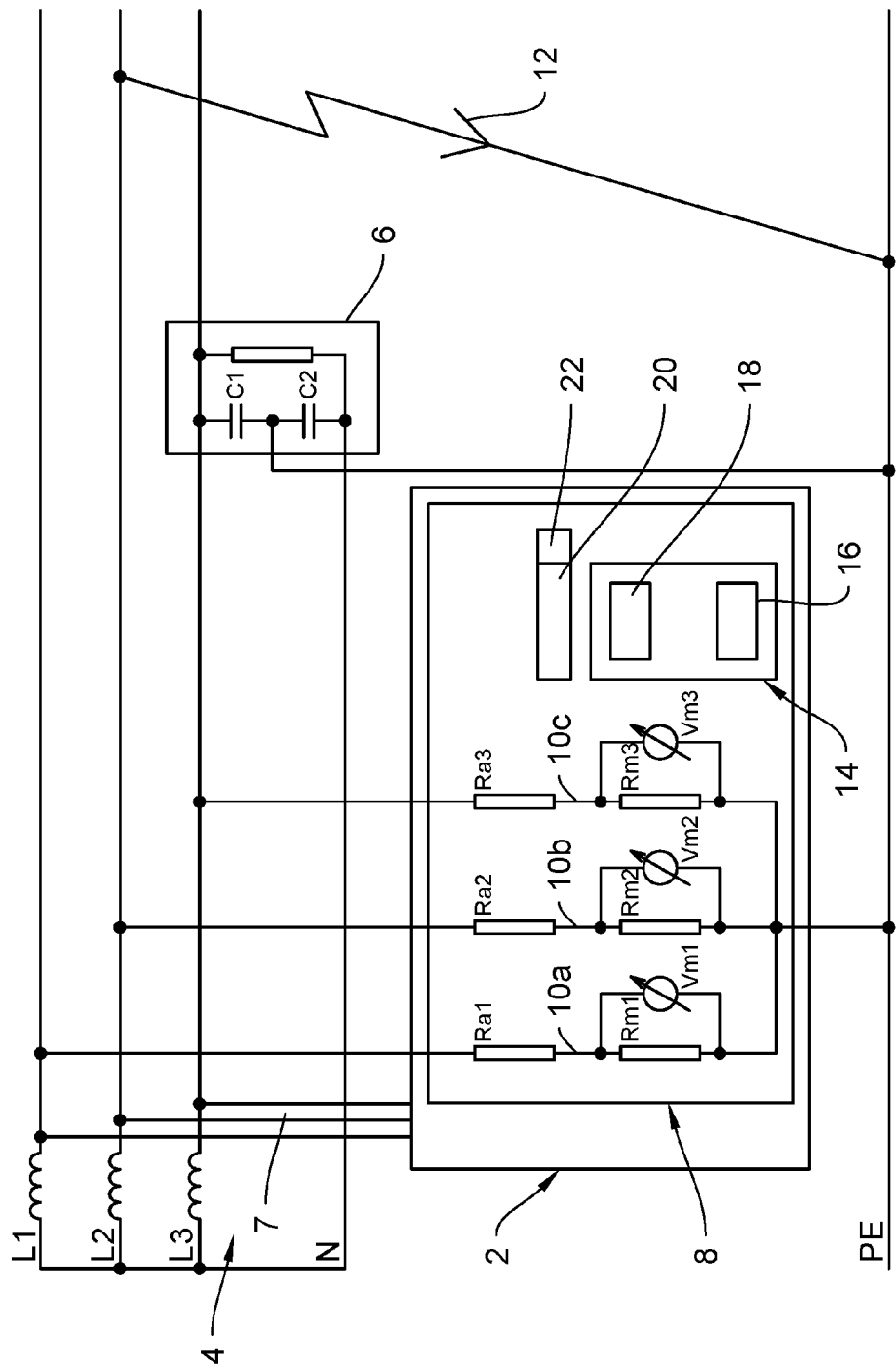

This application claims the benefit of German Patent Application no. 10 2015 207 456.0 filed Apr. 23, 2015, the disclosure of which is incorporated herein by reference.

FIELD OF THE INVENTION

The invention relates to an insulation monitoring device and to a method for conforming-to-standards monitoring of an insulation resistance of an ungrounded single-phase or multi-phase power supply system having at least two active conductors.

BACKGROUND

If higher requirements in terms of operational, fire, and contact safety have to be met when supplying electrical equipment with energy, the network type of an ungrounded power supply system is used, which is also known as an insulated network (French: isolé terre—IT) or IT system. In this kind of power supply system, the active parts are separated from the ground potential, i.e. against ground. The advantage of these networks is that the function of the electrical equipment is not affected in case of a first insulation fault, such as a fault to ground or a fault to frame, because the ideally infinitely large impedance value prevents a closed circuit from forming between the active conductors of the network and ground in this first fault case. In a three-phase IT system, the outer conductors L1, L2, L3 and, if present, the neutral conductor N are referred to as the active conductors. In a single-phase IT system without a center tap, the two outer conductors L1 and L2 are the active conductors; in case of a center tap, the mid-point conductor is an active conductor, too.

The inherent safety of the IT power supply system thus ensures a continuous power supply of the loads fed by the IT power supply system, namely of the equipment connected to the IT power supply system, even if a first insulation fault occurs.

Hence, the resistance of the IT power supply system against ground (insulation resistance; also called insulation fault resistance or fault resistance in the fault case) is continuously monitored because another potential fault on another active conductor (second fault) would cause a fault loop and the resulting fault current, in connection with an overcurrent protection device, would lead to a shut-down of the installation and to a standstill of operation. According to standard IEC 61557-8, the IT power supply system is monitored by means of an insulation monitoring device, which is connected between at least one of the active conductors of the IT power supply system and ground. In addition, the insulation monitoring device usually comprises an insulation-resistance measuring path having a measuring-voltage source, which superimposes a measuring voltage on the power supply system between the active conductor and ground. Based on a rising measuring current, a deterioration of the insulation state of the IT power supply system is registered and reported in time.

Thus, insulation faults are detected sooner by a factor of 1000 to 1,000,000 compared to grounded power supply systems and, additionally, symmetrical faults can be detected. Moreover, it is possible to measure the insulation resistance in shut-down systems, as well, and insulation monitoring can be performed irrespectively of whether the system is an alternating-current, a direct-current, or a mixed system. Despite these advantages, the IT power supply system is still relatively rarely used in comparison to grounded power supply systems. One reason for this is the problem of excess voltage, which is described below and solved by the invention.

In an IT power supply system, there is the danger that when a low-resistance insulation fault occurs on one of the outer conductors, a potential difference to ground potential (excess voltage) occurs, for which the connected equipment (loads) is not designed. For instance, in case of a dead ground fault of an outer conductor in a three-phase power supply system having a neutral conductor and a nominal voltage of 230 V between the outer conductor and the neutral conductor, the outer-conductor voltage against ground rises by the factor of 1.73 to the maximum value of about 400 V on the two fault-free outer conductors.

This excess voltage is problematic if the fault elimination measures (e.g. Y capacitors) at the connected equipment (loads) are not designed for this increased potential difference.

Moreover, there is higher strain on the insulating materials of the lines, which might be damaged permanently.

While it is possible in a power supply system fully planned as an IT network to configure the fault elimination measures against ground in the loads connected to the IT power supply system for the maximum potential difference from the outset, this is disadvantageous in that, on the one hand, it must be ensured for the entire lifespan of the installation that no (other) loads are used that are suitable for the nominal network voltage only and not for the increased potential difference. This, in turn, requires a technical understanding of the described problem of excess voltage, which in reality is often unavailable on site. On the other hand, grounded power supply systems could be converted into ungrounded power supply systems only by replacing all loads unsuitable for the increased potential difference, which is unpractical for economic reasons.

SUMMARY

Therefore, the object of the present invention is to solve the problems described above resulting from excess voltage when operating an ungrounded single-phase or multi-phase power supply system and when converting a grounded power supply system into an ungrounded power supply system in the most cost-efficient manner possible.

This object is attained in connection with the preamble of claim 1 in that the insulation monitoring device comprises a voltage monitoring circuit that detects a conductor voltage between at least one of the active conductors and ground and generates a shut-down signal for shutting down the power supply system if an excess voltage is detected.

The idea of the present invention is based, in accordance with the invention, on equipping an insulation monitoring device required according to standards with a voltage monitoring circuit permanently measuring the respective voltages to ground potential, i.e. between the observed active conductor and ground, for the active conductors to be monitored. If an excess voltage is detected on an active conductor, the voltage monitoring circuit generates a shut-down signal, which is available as an output signal and can be processed outside of the insulation monitoring device, so as to trigger a switching element, for example, to shut down the power supply system.

In addition to avoiding risks that may arise from the influence of the excess voltage on fault elimination or insulation devices not designed for potential differences of this kind, the combination according to the invention of insulation monitoring and voltage monitoring uses the correlation that the excess voltage is a function of the size of the insulation fault. A dead ground fault, which is an almost zero-resistance insulation fault, leads to a maximum excess voltage and thus to a shut-down of the power supply system, whereas a high-resistance insulation fault merely triggers a warning required according to standards, as is the case in a conventional insulation monitoring device. In this case, there remains enough time to locate the insulation fault and to fix it before a shut-down occurs.

In an advantageous fashion, the safety-related benefit of insulation monitoring is thus connected with the elimination of dangers due to excess voltage. The principle of preventive monitoring with the aim of avoiding the shut-down of the power supply stays intact.

The insulation monitoring device supplemented according to the invention with the voltage monitoring circuit allows the intended installation of ungrounded power supply systems with the resulting advantages of the IT network even in application cases that would otherwise be reserved to other network types.

The voltage monitoring device allows the use of any type of equipment without having to know its electrical strength to ground potential.

Furthermore, the solution according to the invention is ideally suited for the conversion of grounded power supply systems into ungrounded power supply systems. Since an excess voltage cannot occur in grounded power supply systems, this problem is disregarded at first and will occur only when a grounded power supply system is supposed to be converted into an ungrounded power supply system. The insulation monitoring according to the invention including shut-down in case of an excess voltage has the advantageous result that the power supply system can be converted without having to pay closer attention to the loads with respect to their electrical strength. All advantages of the IT system can be utilized—except for the operation in case of a low-resistance ground fault (dead ground fault, see above). However, since a grounded power supply system, too, would immediately shut down in case of such a ground fault, this does not constitute a disadvantage vis-à-vis the (unconverted) grounded power supply system.

In an advantageous embodiment, the voltage monitoring circuit has at least one voltage measuring path connecting the respective active conductor to ground for monitoring the conductor voltage.

Owing to this additional coupling of the insulation monitoring device by means of the voltage measuring path provided in the voltage monitoring circuit (in addition to the connection via the insulation-resistance measuring path for insulation-resistance measuring), precisely those voltages to ground can be registered that correspond to the voltages at the fault elimination devices at the loads.

The number of voltage measuring paths in the voltage monitoring circuit via which the insulation monitoring device for registering the conductor voltage is coupled depends on the type of power supply system and on the protection target. In addition to the possibility of performing targeted monitoring of selected active conductors, the measured parameters are usually registered as comprehensively as possible. This does not necessarily involve the provision of voltage measuring paths for all outer conductors. Thus, it is possible to calculate an unknown voltage based on the measurements of a sufficient number of outer-conductor voltages.

Hence, in a single-phase power supply system having two outer conductors, the voltage measuring circuit advantageously comprises two voltage measuring paths, each connecting one outer conductor to ground. If the single-phase power supply system is equipped with a center tap, preferably three voltage measuring paths connect one of the two outer conductors and the mid-point conductor to ground, respectively.

In a three-phase power supply system having three outer conductors, the voltage monitoring circuit preferably comprises three voltage measuring paths, each connecting one of the three outer conductors to ground. In case of an additionally present neutral conductor, the latter can be connected to ground via a voltage measuring path as well.

The coupling points of the voltage measuring paths can be located directly downstream of the feeding point and thus upstream of a residual-current protection device (viewed in the direction of the load) or downstream of a residual-current protection device at the load side.

The load-side coupling of the insulation monitoring device allows monitoring of a shut-down power supply (sub)system so that the shut-down system portion is connected only in the fault-free state. The connection may take place automatically or by an activation signal of the insulation monitoring device. However, the load-side arrangement requires a separate auxiliary voltage of the insulation monitoring device.

Furthermore, the voltage measuring path forms a series connection of a coupling resistor and a measuring resistor, a voltage measuring device being arranged parallel to the measuring resistor.

In the voltage measuring path, the conductor voltage of the active conductor at the measuring resistor series-connected to the coupling resistor can be measured by means of the voltage measuring device.

In another embodiment, the voltage measuring path and an insulation-resistance measuring path are configured as a combined resistance measuring path having a series-connected measuring-voltage source.

For the purpose of determining the insulation resistance and determining the conductor voltage, separate parallel measuring paths, namely the insulation-resistance measuring path and the voltage measuring path, are provided for the respective active conductors in the previously described embodiments according to their respective measuring task.

However, the two measuring tasks can be integrated not only functionally but also in terms of circuits in the insulation monitoring device. A single combined resistance measuring path consisting of a series connection of the coupling resistor, the measuring resistor (having a parallel-connected voltage measuring device) and the measuring-voltage source toward the respective active conductor allows combined registering of the parameters needed for determining the insulation resistance and the conductor voltage.

Furthermore, the voltage monitoring circuit advantageously comprises an evaluating device having an adjustable threshold-value detector.

To detect the excess voltage between the respective active conductor and ground, a threshold-value detector is provided in the evaluating device, said threshold-value detector assessing the voltage values transmitted by the voltage measuring device. The threshold-value detector is configured to be adjustable so that the measured voltage values can be checked for exceedance of a voltage threshold value adapted to the power supply system to be monitored. Thus, it is possible to exploit correspondingly specified tolerances of the electrical installation and of the connected equipment and to shut down the power supply system only if there actually are consequences or risks due to the excess voltage that may be detrimental to the function of the system.

Furthermore, the evaluating device comprises a transient detection device for detecting non-hazardous transient voltage spikes.

The transient detection device prevents short-term interferences, such as occasional voltage spikes, from being mistakenly interpreted as permanent excess voltages, which would lead to an unwarranted shut-down.

Preferably, the voltage monitoring circuit comprises an alarm circuit having at least one signal output for providing an analog and/or digital switching signal.

If an excess voltage is detected, a switching signal for shutting down the power supply system is generated. This task is performed by the alarm circuit, which provides a shut-down signal in analog and/or digital form at the signal output of the insulation monitoring device for further processing.

With the switching signal, subsequent switching elements can be controlled. For example, the switching signal can be used in the form of a switched control current to control an electromechanical contactor and can also cause a controlled reactivation of a shut-down power supply (sub)system in addition to the shut down.

In another embodiment, the voltage monitoring circuit comprises an alarm relay.

In connection with a residual-current protective device, its shut-down function can be utilized by generating a trigger current caused on purpose by the alarm relay of the voltage monitoring circuit. Analogously to the generating of a test current upon pressing of the test key in residual-current protection devices, the trigger current triggers the residual-current protection device.

Thus, a commercially available residual-current protection device (residual-current circuit breaker) can be used as a very cost-effective shut-down means independent of the manufacturer to shut down the power supply system, advantageously no communication (bus communication) being necessary between the insulation monitoring device according to the invention and the residual-current protection device. The alarm relay can also be used to switch a control current for a switching element (contactor), the alarm relay being controlled via an internal control signal or via the signal output.

With respect to a method, the object of the invention is attained in connection with the preamble of claim 9 in that a conductor voltage between at least one of the active conductors and ground is measured and a shut-down signal for shutting down the power supply system is generated if an excess voltage is detected.

The implementation of the above-described insulation monitoring device according to the invention is based on the technical teaching described in independent method claim 9. In this respect, the above-described technical effects and the advantages resulting therefrom apply to the method features as well.

Registering of the conductor voltages and the provision of the shut-down signal in case of a detected excess voltage at one of the active conductors contribute to the preventive maintenance of ungrounded power supply systems. Owing to these measures in accordance with the invention, the protective function of a conventional insulation monitoring device required according to standards is advantageously extended to the monitoring of hazardous excess voltages.

In another embodiment, a voltage threshold value is set to detect an excess voltage between the active conductor and ground.

This setting takes place in the threshold-value detector and allows adapting a voltage threshold value to the power supply system to be monitored.

Advantageously, non-hazardous transient voltage spikes are disregarded in the detection of an excess voltage.

If transient voltage spikes occur in the measured voltages, they are detected by a transient detection device in the evaluating device and are disregarded in terms of an interpretation as an excess voltage so as to avoid faulty shut-downs.

In another preferred embodiment, a trigger current for a residual-current protection device is generated to trigger the residual-current protection device.

By generating an intentionally caused trigger current, an already present residual-current protection device can be triggered. In this way, a cost-efficient shut-down option is provided, which is particularly suitable for retrofitting in an existing power supply system.

Another embodiment comprises the generation of a control current for a switching element.

In connection with any kind of switching elements, in particular also with switching elements that are capable of non-manual reactivation, a switching signal in the form of a control current can be transmitted. For this purpose, the insulation monitoring device has a signal output that is capable of driving a corresponding control current.

Furthermore, a control current for the switching element can be generated that acts as a reactivation signal and causes an automatic reactivation of a shut-down power supply subsystem.

If the insulation monitoring device continues monitoring the insulation in the shut-down power supply (sub)system, it can be automatically reconnected again when the low-resistance insulation fault and thus the cause of the excess voltage is eliminated. However, in this application case, safety measures have to be taken that protect the user from an unexpected reconnection.

BRIEF DESCRIPTION OF THE DRAWING FIGURES

Figure 2:
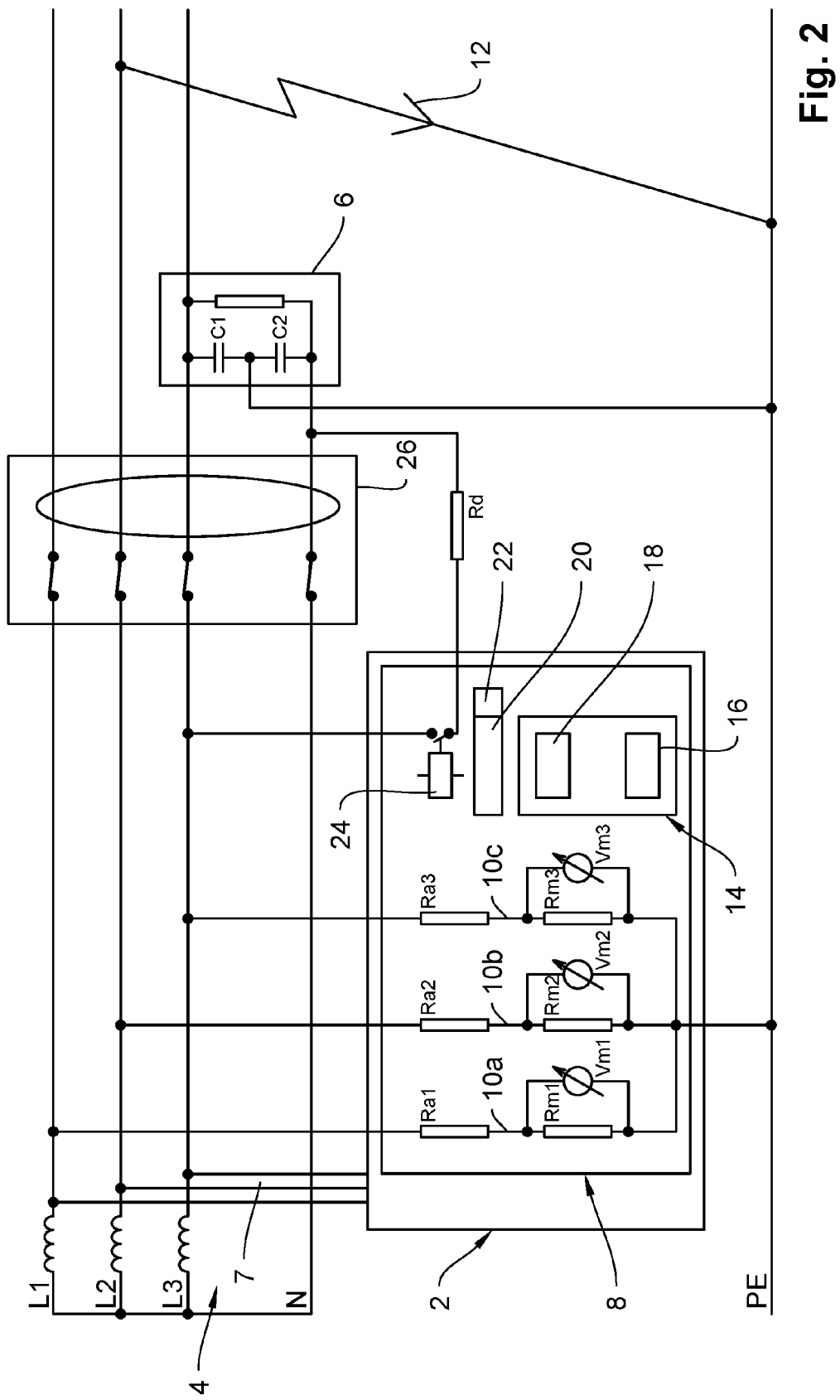
Figure 3:
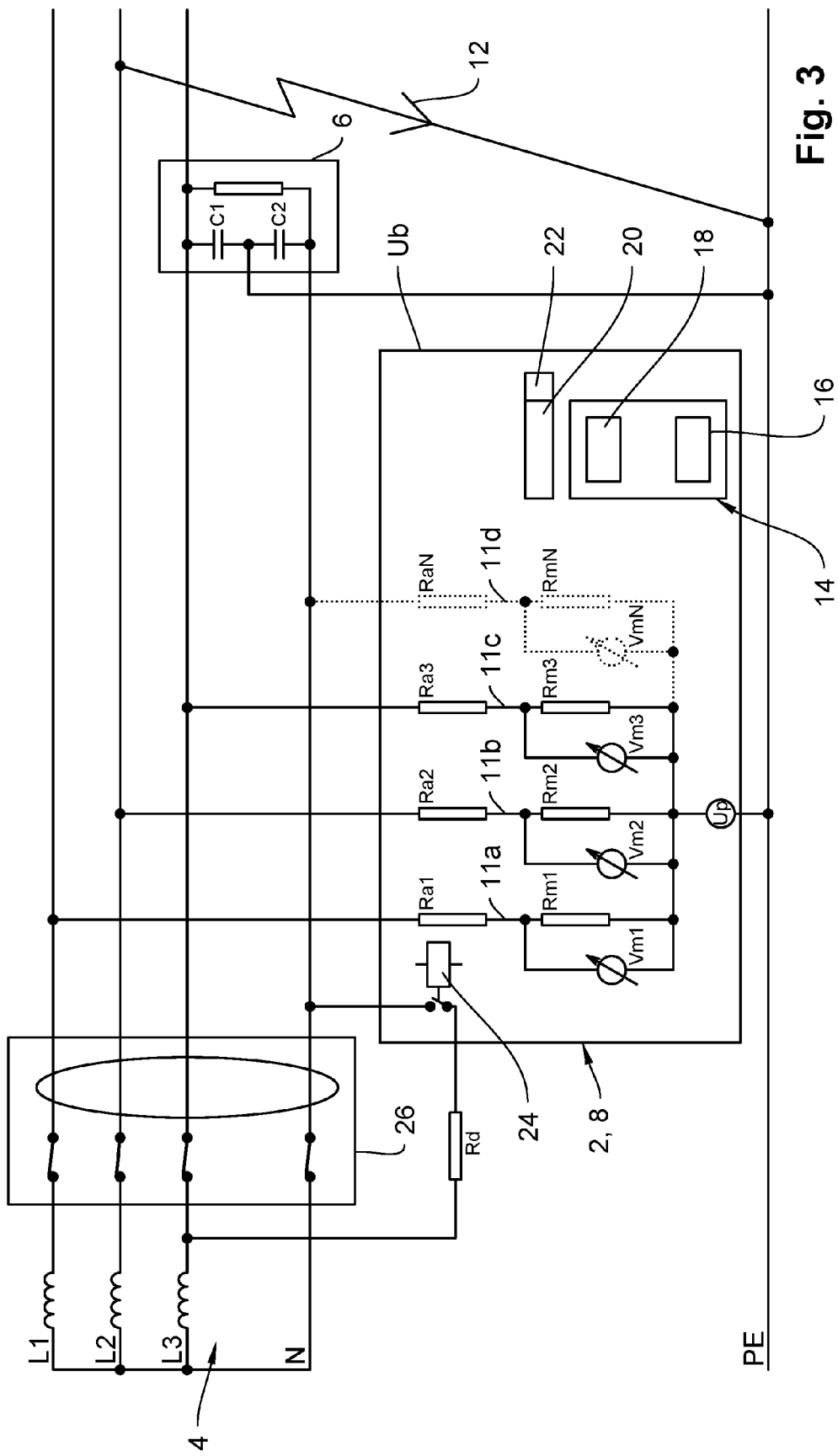
Figure 4:
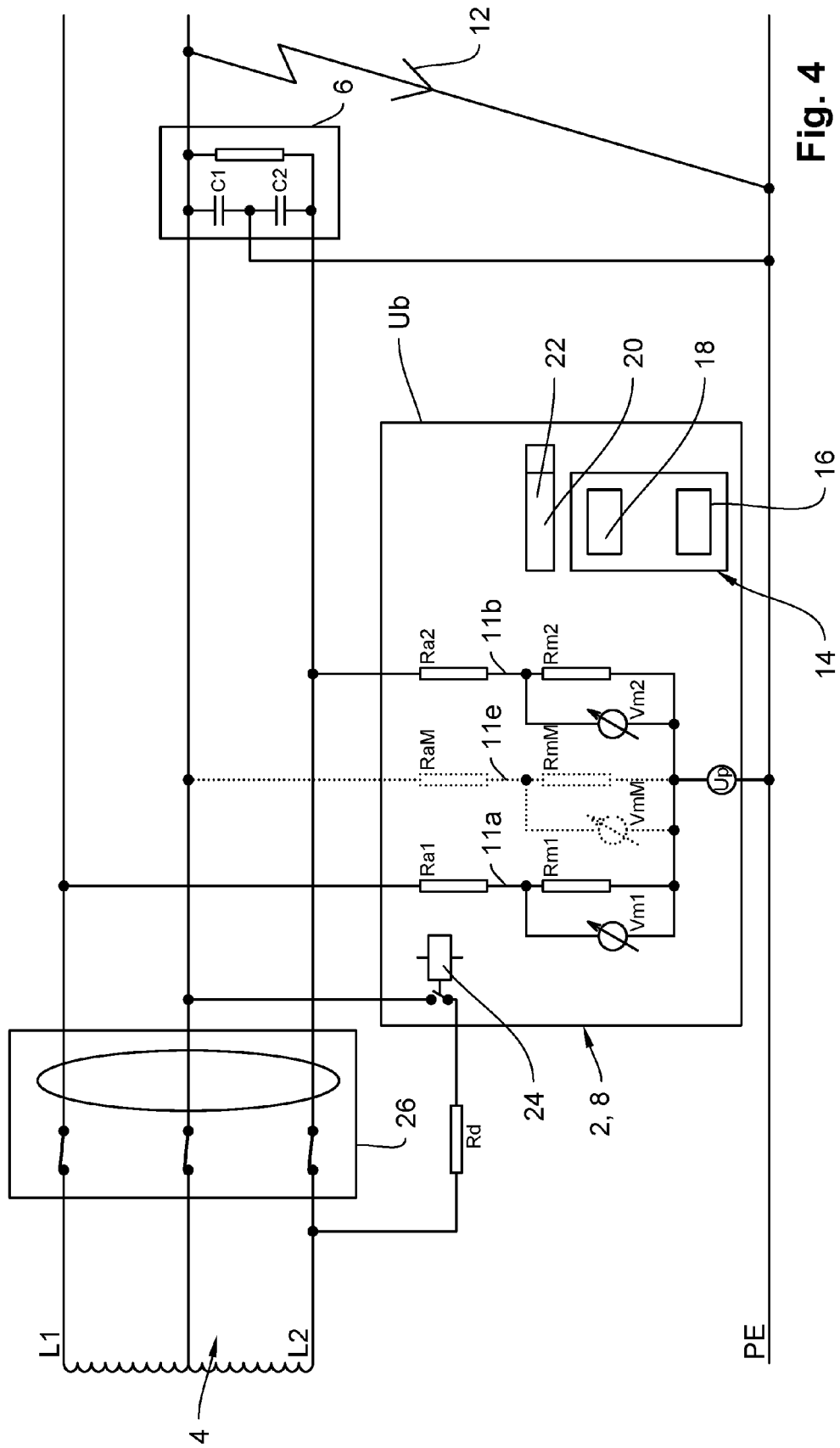
Figure 5:
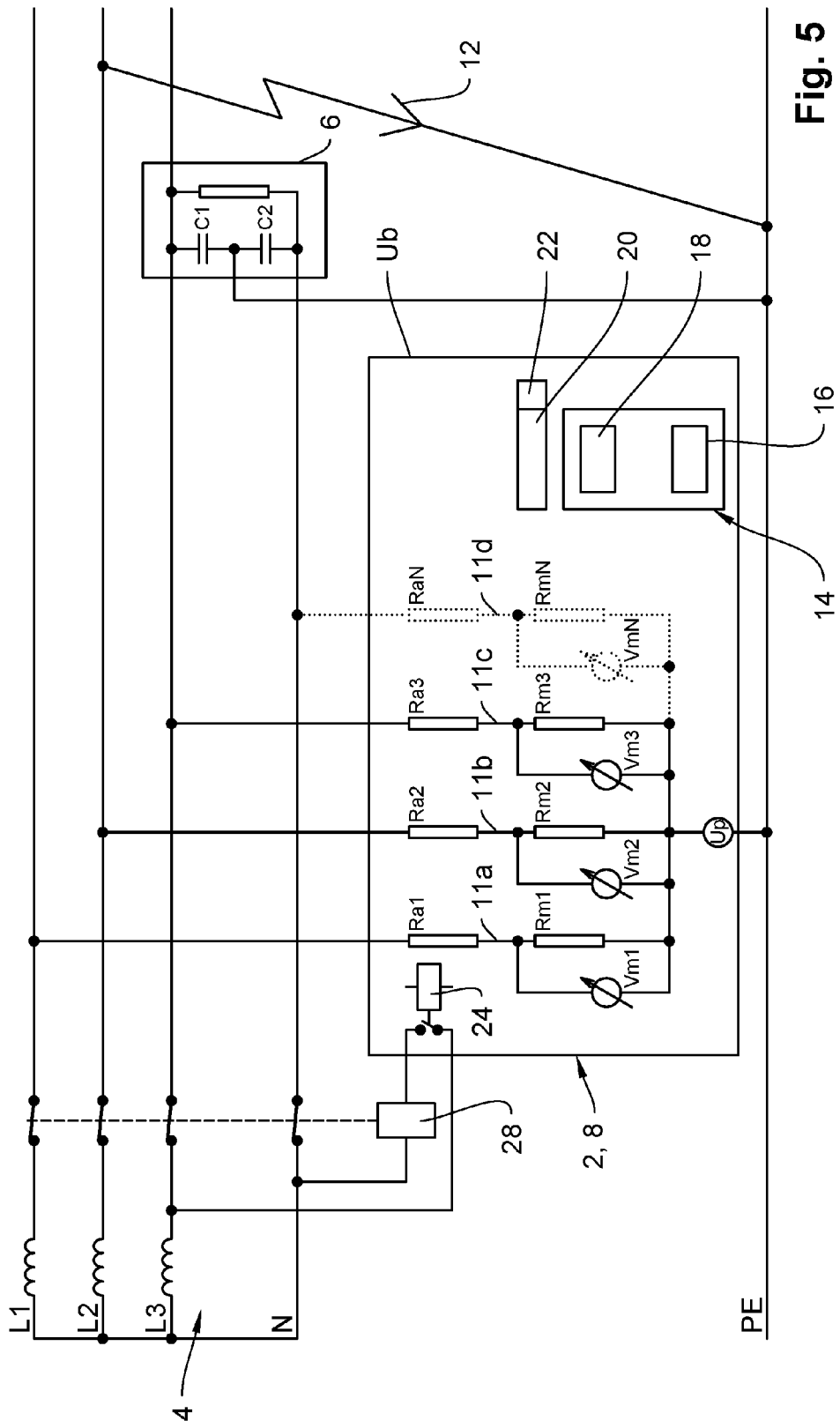

Other advantageous embodiment features become apparent from the following description and from the drawing, which illustrates a preferred embodiment of the invention with the aid of examples. In the drawing:

FIG. 1: shows an insulation monitoring device according to the invention in an ungrounded three-phase power supply system;

FIG. 2: shows an embodiment of the insulation monitoring device according to the invention having an alarm relay in connection with a residual-current protection device;

FIG. 3: shows an embodiment of the insulation monitoring device according to the invention having combined resistance measuring paths and load-side coupling in a three-phase power supply system;

FIG. 4: shows an embodiment of the insulation monitoring device according to the invention having combined resistance measuring paths and load-side coupling in a single-phase power supply system; and FIG. 5: shows an embodiment of the insulation monitoring device according to the invention in connection with a connector as a switching element.

DETAILED DESCRIPTION

FIG. 1 shows an insulation monitoring device 2 according to the invention in an ungrounded three-phase power supply system 4 having outside conductors L1, L2 and L3 and a present neutral conductor N. The ungrounded (IT) power supply system 4 is separated from the ground potential (ground) PE, whereas a load 6 connected to the outer conductor L1 and the neutral conductor N is connected to ground via the suppression capacitors C1 and C2.

The insulation monitoring device 2 is three-phase connected to the outer conductors L1, L2 and L3 via insulation-resistance measuring paths 7 for insulation-resistance measurement. The neutral conductor N is present in this example, but it is not connected to the insulation monitoring device 2.

For voltage measuring, the insulation monitoring device 2, in accordance with the invention, comprises a voltage monitoring circuit 8, which comprises a voltage measuring path 10a, 10b, 10c for the outer conductors L1, L2, L3, each of said voltage measuring paths consisting of a series connection of a coupling resistor Ra1, Ra2, Ra3 with a measuring resistor Rm1, Rm2, Rm3. A voltage measuring device Vm1, Vm2, Vm3 is arranged parallel to the measuring resistor Rm1, Rm2, Rm3, by means of which the outer-conductor voltages occurring on the outer conductors L1, L2, L3 are measured.

In the illustrated case of a dead ground fault 12 of the outer conductor L2, the outer-conductor voltages to ground PE on the non-faulty outer conductors L1 and L3 increase. The excess voltages are detected in an evaluating device 14, which is connected to the voltage measuring devices Vm1, Vm2, Vm3 and comprises an adjustable threshold-value detector 16. To avoid wrong decisions in response to transient voltage spikes, which do not represent a permanent excess voltage, transient detection 18 is performed in the evaluating device 14. In case of an actual excess voltage, an alarm circuit 20 generates an analog and/or digital shut-down signal, which is provided at a signal output 22.

FIG. 2 illustrates an embodiment of the insulation monitoring device 2 according to the invention additionally equipped with an alarm relay 24 in connection with a residual-current protection device 26 as a switching element. In case of a detected excess voltage, the alarm relay 24 connects a resistor Rd between one of the outer conductors L1, L2, L3 upstream of the residual-current protection device 26 and either the neutral conductor N or another outer conductor L1, L2, L3 downstream of the residual-current protection device 26. Thus, a trigger current flowing through the resistor Rd is generated, which triggers the residual-current protection device 26 and interrupts the power supply system 4. The height of the generated trigger current depends on the response differential current of the used residual-current protection device 26 and can be a 30 mA alternating current, for example.

FIG. 3 shows an embodiment of the insulation monitoring device 2 according to the invention having combined resistance measuring paths 11a to 11d and load-side coupling in a three-phase power supply system 4. The insulation-resistance measuring paths 7 illustrated in FIG. 1 have been combined with the voltage measuring paths 10a, 10b, 10c shown in FIG. 1 to form combined resistance measuring paths 11a, 11b, 11c. Optionally, a combined resistance measuring path 11d toward the neutral conductor N can be present as well. The resistance measuring paths 11a to 11d are further supplemented with the measuring-voltage source Up, which superimposes a measuring voltage on the power supply system 4 for determining the insulation resistance.

In this application, the insulation monitoring device 2 having an integrated voltage monitoring circuit 8 is arranged downstream of the residual-current protection device 26 at the load side (viewed in the direction of the load 6) and is connected to an auxiliary voltage source Ub.

Analogously to the illustration if FIG. 3, FIG. 4 shows the operation of an insulation monitoring device 2 in a single-phase power supply system 4 having a mid-point tap. The combined resistance measuring paths 11a, 11b are used to determine the insulation resistance and to measure the conductor voltages and they connect the outer conductors L1, L2 to ground. The center tap can optionally have another resistance measuring path 11e having a coupling resistor RaM, a measuring resistor RmM and a voltage measuring device VmM.

Based on the illustration in FIG. 3, FIG. 5 shows an embodiment of the insulation monitoring device 2 according to the invention in connection with a connector 28 as a switching element. As in the illustrated case, the control current for the conductor 28 can be tapped from the power supply system 4 and can be connected via the alarm relay 24. Alternatively, a shut-down signal provided by the signal output 22 can also be used as a control current for the connector 28.

The invention claimed is:

1. An insulation monitoring device (2) required according to electrical safety standards for monitoring of an insulation resistance of an ungrounded single-phase or multi-phase power supply system (4) having at least two active conductors (L1, L2, L3, N), characterized by a voltage monitoring circuit (8) supplementing the monitoring of the insulation resistance by registering a conductor voltage between at least one of the active conductors (L1, L2, L3, N) and ground and generating a shut-down signal for shutting down the power supply system if an excess voltage is detected, wherein the voltage monitoring circuit (8) has at least one voltage measuring path (10a, 10b, 10c) connecting the respective active conductors (L1, L2, L3, N) to ground for registering the conductor voltage and the voltage measuring path (10a, 10b, 10c) and an insulation-resistance measuring path (7) are configured as a combined resistance measuring path (11a, 11b, 11c, 11d) having a series-connected measuring-voltage source (Up).

2. The insulation monitoring device (2) according to claim 1, characterized in that the voltage measuring path (10a, 10b, 10c) forms a series connection of a coupling resistor (Ra1, Ra2, RaN) and a measuring resistor (Rm1, Rm2, Rm3, RmN), a voltage measuring device (Vm1, Vm2, Vm3, VmN) being arranged parallel to the measuring resistor (Rm1, Rm2, Rm3, RmN).

3. The insulation monitoring device (2) according claim 1, characterized in that the voltage monitoring circuit (8) comprises an evaluating device (14) having an adjustable threshold-value detector (16).

4. The insulation monitoring device (2) according to claim 3, characterized in that the evaluating device (14) comprises a transient detection device (18) for detecting non-hazardous transient voltage spikes.

5. The insulation monitoring device (2) according to claim 1 characterized in that the voltage monitoring circuit (8) comprises an alarm circuit (20) having at least one signal output (22) for providing an analog and/or a digital switching signal.

6. The insulation monitoring device (2) according to claim 1, characterized in that the voltage monitoring device (8) comprises an alarm relay (24).

7. A method required according to electrical safety standards for monitoring of an insulation resistance of an ungrounded singe-phase or multi-phase power supply system (4) having at least two active conductors (L1, L2, L3, N)

by means of an insulation monitoring device (2), characterized in that by supplementing the required monitoring of the insulation resistance a conductor voltage between at least one of the active conductors and ground is measured and a shut-down signal for shutting down the power supply system (4) is generated if an excess voltage is detected, wherein monitoring of the insulation resistance and measuring of the conductor voltage is done via a combined resistance measuring path.

8. The method according to claim 7, characterized in that a voltage threshold value is set for detecting an excess voltage between the active conductor and ground.

9. The method according to claim 7, characterized in that non-hazardous transient voltage spikes are disregarded.

10. The method according to claim 7, characterized in that a trigger current for a residual-current protection device (26) is generated in order to trigger the residual-current protection device (26).

11. The method according to claim 7, characterized in that a control current for a switching element is generated.

12. The method according to claim 11, characterized in that a control current for the switching element is generated that acts as a reactivation signal and causes a shut-down power supply subsystem to be reactivated.

\* \* \* \* \*